(12) United States Patent
Seo

(10) Patent No.: US 10,445,024 B2
(45) Date of Patent: Oct. 15, 2019

(54) SEMICONDUCTOR INTEGRATED CIRCUIT CARDS AND COMMUNICATION SYSTEMS INCLUDING THE SAME

(71) Applicant: Samsung Electronics Co., Ltd., Suwon-si (KR)

(72) Inventor: Hui-Kwon Seo, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/793,469

(22) Filed: Oct. 25, 2017

(65) Prior Publication Data

US 2018/0189002 A1 Jul. 5, 2018

(30) Foreign Application Priority Data

Dec. 29, 2016 (KR) .................. 10-2016-0182372

(51) Int. Cl.

| | |
|---|---|
| *G06F 3/06* | (2006.01) |
| *H01L 27/02* | (2006.01) |
| *H01L 23/498* | (2006.01) |
| *H04B 1/401* | (2015.01) |
| *H01L 23/50* | (2006.01) |
| *H01L 27/11526* | (2017.01) |
| *H04B 1/3816* | (2015.01) |

(52) U.S. Cl.
CPC ...... *G06F 3/0679* (2013.01); *H01L 23/49855* (2013.01); *H01L 23/50* (2013.01); *H01L 27/0203* (2013.01); *H01L 27/11526* (2013.01); *H04B 1/3816* (2013.01); *H04B 1/401* (2013.01)

(58) Field of Classification Search
CPC . G06F 3/0679; H01L 23/49855; H01L 23/50; H01L 27/0203; H01L 27/11526; H04B 1/401
See application file for complete search history.

(56) References Cited

U.S. PATENT DOCUMENTS

| | | |
|---|---|---|
| 7,243,856 B2 | 7/2007 | Agami et al. |
| 7,734,279 B2 | 6/2010 | Fantini et al. |
| 8,291,144 B2 | 10/2012 | Pinto et al. |
| 8,364,203 B2 | 1/2013 | Morel et al. |
| 9,367,447 B2 | 6/2016 | Shacham et al. |

(Continued)

FOREIGN PATENT DOCUMENTS

| | | |
|---|---|---|
| KR | 10-2006-0059061 | 6/2006 |
| KR | 10-0745487 | 8/2007 |

(Continued)

*Primary Examiner* — Nguyen T Vo
(74) *Attorney, Agent, or Firm* — Muir Patent Law, PLLC

(57) ABSTRACT

A semiconductor integrated card includes an external package, a subscriber identification module (SIM) circuit, a plurality of SIM pins, a storage device and a plurality of memory pins. The SIM circuit is formed inside of the external package and is configured to store subscriber information. The SIM pins are formed on a surface of the external package and are electrically connected to the SIM circuit. The storage device is formed inside of the external package and is separated from the SIM circuit. The storage device includes a nonvolatile memory device. The memory pins are formed on the surface of the external package and are electrically connected to the storage device.

11 Claims, 12 Drawing Sheets

(56) References Cited

U.S. PATENT DOCUMENTS

| | | | |
|---|---|---|---|
| 2003/0154326 A1 | 8/2003 | Tseng et al. | |
| 2004/0210715 A1* | 10/2004 | Harari | G06K 19/07 711/115 |
| 2005/0189426 A1* | 9/2005 | Nishizawa | G06K 19/07 235/492 |
| 2005/0273648 A1* | 12/2005 | Mambakkam | G06F 11/1435 714/6.12 |
| 2008/0257960 A1* | 10/2008 | Jin | G06K 7/0008 235/441 |
| 2011/0047053 A1 | 2/2011 | Kim et al. | |
| 2011/0051352 A1 | 3/2011 | Kim et al. | |
| 2012/0083316 A1 | 4/2012 | Lee et al. | |
| 2014/0004903 A1* | 1/2014 | Tsai | H04B 1/3816 455/558 |
| 2015/0049746 A1 | 2/2015 | Hershko et al. | |
| 2015/0160880 A1 | 6/2015 | Jang et al. | |
| 2015/0356040 A1 | 12/2015 | Shin et al. | |
| 2016/0113115 A1 | 4/2016 | Kwon et al. | |

FOREIGN PATENT DOCUMENTS

| | | |
|---|---|---|
| KR | 10-0963544 | 6/2010 |
| KR | 10-1013032 | 2/2011 |
| KR | 10-1025803 | 4/2011 |
| KR | 10-1060730 | 8/2011 |
| KR | 10-1089405 | 12/2011 |
| KR | 10-2012-0015758 | 2/2012 |
| KR | 10-2016-0046521 | 4/2016 |
| WO | WO 2014/170725 | 10/2014 |

\* cited by examiner

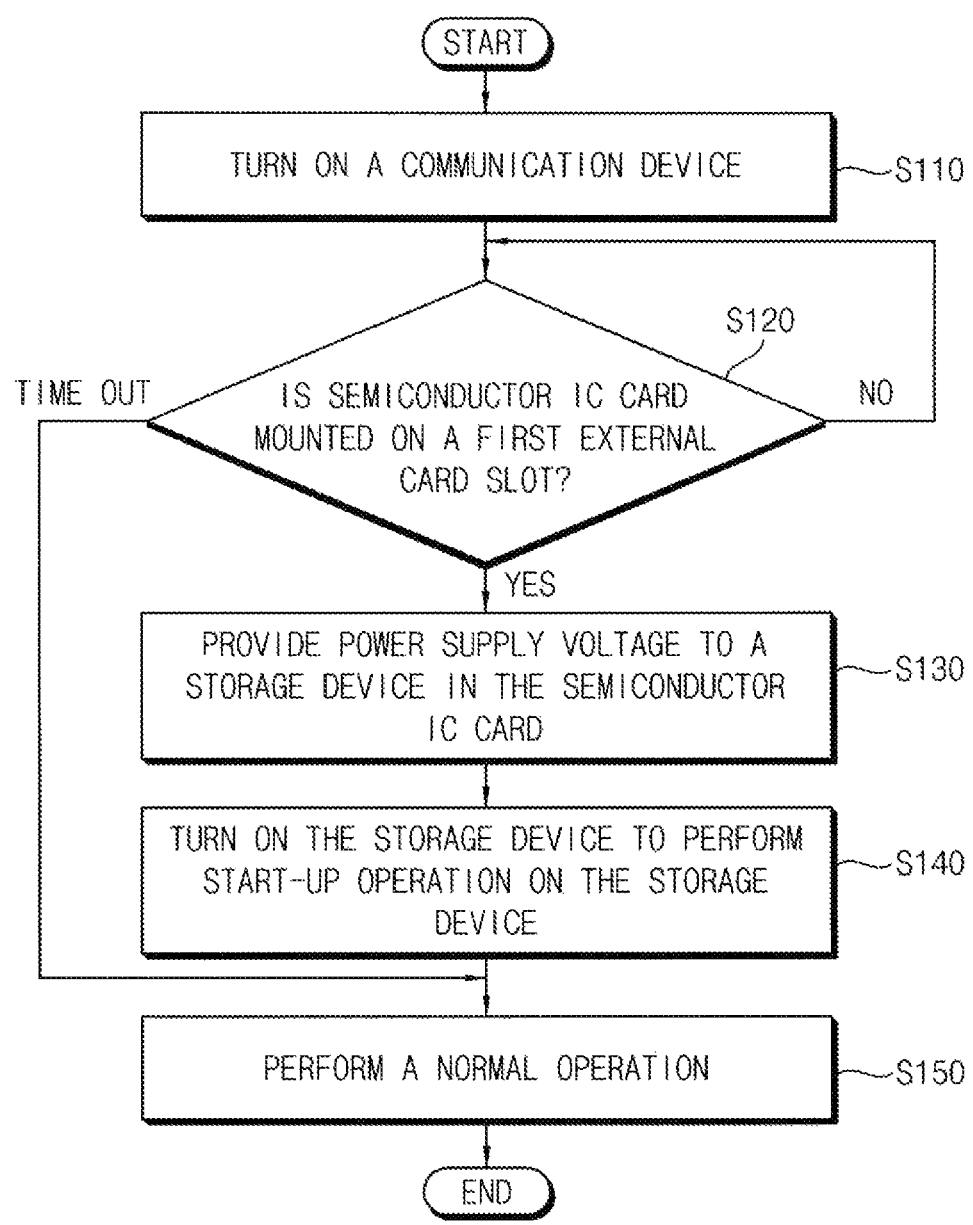

SEMICONDUCTOR INTEGRATED CIRCUIT CARDS AND COMMUNICATION SYSTEMS INCLUDING THE SAME

CROSS-REFERENCE TO RELATED APPLICATION

This U.S. application claims priority under 35 USC § 119 to Korean Patent Application No. 10-2016-0182372, filed on Dec. 29, 2016, in the Korean Intellectual Property Office, the disclosure of which is incorporated by reference in its entirety herein.

BACKGROUND

1. Technical Field

Exemplary embodiments relate to semiconductor integrated circuit (IC) cards, and more particularly to semiconductor IC cards capable of performing a function of a subscriber identification module (SIM) card and a function of a storage device simultaneously and communication systems including the same.

2. Discussion of the Related Art

Recently, when a communication device such as a smart phone is to perform wireless communications, a SIM card is connected to the communication device.

SUMMARY

Some exemplary embodiments provide a semiconductor integrated circuit (IC) card capable of performing a function of a subscriber identification module (SIM) card and a function of a storage device simultaneously.

Some exemplary embodiments provide a communication system including the semiconductor IC card.

According to exemplary embodiments, a semiconductor IC card includes an external package, a SIM circuit, a plurality of SIM pins, a storage device and a plurality of memory pins. The SIM circuit is formed inside of the external package and is configured to store subscriber information. The SIM pins are formed on a surface of the external package and are electrically connected to the SIM circuit. The storage device is formed inside of the external package and is separated from the SIM circuit. The storage device includes a nonvolatile memory device. The memory pins are formed on the surface of the external package and are electrically connected to the storage device.

According to exemplary embodiments, a semiconductor IC card includes an external package, a SIM circuit, a plurality of SIM pins, a storage device and a plurality of memory pins. The external package has two pairs of edges, in which the edges of each pair are arranged opposite to each other. The SIM circuit is formed inside of the external package, and is configured to store subscriber information. The SIM pins are formed on a surface of the external package and are electrically connected to the SIM circuit. The storage device is formed inside of the external package and is separated from the SIM circuit. The storage device includes a nonvolatile memory device. The memory pins are formed on the surface of the external package and are electrically connected to the storage device.

According to exemplary embodiments, a communication device includes a first external card slot and a second external card slot. The semiconductor IC card is mounted on the first external card slot, and is configured to perform a first function to store data provided from the communication device and a second function to perform a subscriber authentication using a first subscriber information when the communication device performs a wireless communication via a first wireless network. The semiconductor IC card includes an external package, a SIM circuit, a plurality of SIM pins, a storage device and a plurality of memory pins. The SIM circuit is formed inside of the external package and is configured to store the subscriber information. The SIM pins are formed on a surface of the external package and are electrically connected to the SIM circuit. The storage device is formed inside of the external package and is separated from the SIM circuit. The storage device includes a nonvolatile memory device. The memory pins are formed on the surface of the external package and are electrically connected to the storage device.

Accordingly, the semiconductor IC card may perform a function of a SIM card and a function of a storage device simultaneously. Therefore, a communication system including the semiconductor IC card may connect to a SIM card semiconductor device and a storage device using fewer external card slots.

BRIEF DESCRIPTION OF THE DRAWINGS

Illustrative, non-limiting exemplary embodiments will be more clearly understood from the following detailed description in conjunction with the accompanying drawings.

FIG. 13 is a flow chart illustrating an initial operation of the communication system of FIGS. 9 and 10.

DETAILED DESCRIPTION OF THE EMBODIMENTS

Figure 1:
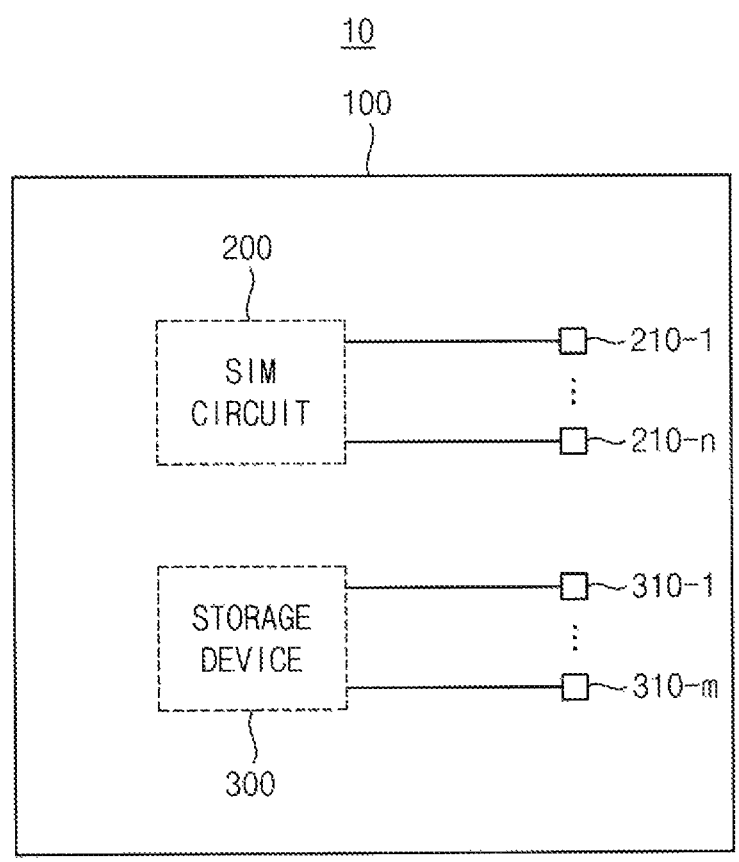
FIG. 1 is a block diagram illustrating a semiconductor integrated circuit (IC) card according to exemplary embodiments.

The present disclosure now will be described more fully hereinafter with reference to the accompanying drawings, in which various exemplary embodiments are shown. The invention may, however, be embodied in many different forms and should not be construed as limited to the exemplary embodiments set forth herein. These example exemplary embodiments are just that—examples—and many embodiments and variations are possible that do not require the details provided herein. It should also be emphasized that the disclosure provides details of alternative examples, but such listing of alternatives is not exhaustive. Furthermore, any consistency of detail between various exemplary embodiments should not be interpreted as requiring such detail—it is impracticable to list every possible variation for every feature described herein. The language of the claims should be referenced in determining the requirements of the invention.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

As is traditional in the field of the disclosed technology, features and embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a block diagram illustrating a semiconductor integrated circuit (IC) card according to exemplary embodiments.

Referring to FIG. 1, a semiconductor IC card 10 may include an external package 100, a subscriber identification module (SIM) circuit 200, a plurality of SIM pins 210-1~210-n, a storage device 300 and a plurality of memory pins 310-1~310-m. Here, n and m are positive integers.

The external package may have an arbitrary size For example, the external package 100 may have a size and shape according to various semiconductor card standards. In an exemplary embodiment, the external package 100 may have a size and shape defined by a SIM card standard. In an exemplary embodiment, the external package 100 may have a size and shape defined by a micro secure digital (SD) card standard.

The SIM circuit 200 may be formed inside of the external package 100. The SIM circuit 200 may store subscriber information for performing wireless communication.

The SIM pins 210-1~210-n may be formed on a surface of the external package 100. The SIM pins 210-1~210-n may comprise conductor pads that provide a contact surface for connecting to a communication device to which it is connected. The SIM pins 210-1~210-n may be electrically connected to the SIM circuit 200 included inside of the external package 100 via package wiring of the external package. For example, the external package 100 may comprise a package substrate having SIM pins 210-1~210-n on a bottom surface (corresponding to the external surface of the external package 100) and one or more redistribution wiring layers, including wiring layers connecting the SIM pins 210-1~210-n to the SIM circuit 200 mounted to an upper surface of the package substrate. The SIM circuit 200 typically comprises a semiconductor integrated circuit chip or a plurality of interconnected semiconductor integrated circuit chips.

As will be described with reference to FIGS. 9 and 10, when the semiconductor IC card 10 is mounted on a communication device, the SIM circuit 200 may be connected to the communication device via the SIM pins 210-1~210-n. The SIM circuit 200 may perform a subscriber authentication using the subscriber information, when the communication device performs wireless communication. For example, the SIM circuit 200 may store a unique serial number (an integrated circuit card ID or ICCID) to identify itself, an international mobile subscriber identity (IMSI) number, security authentication and ciphering information, temporary information related to the local network, a list of the services the user has access to, and passwords, such as a personal identification number (PIN) for ordinary communication device system use (e.g., to allow access and operation of the communication device upon entry and verification of the PIN) and a personal unblocker code (PUK) for PIN unlocking.

The storage device 300 may be formed inside of the external package 100. The storage device 300 may include a nonvolatile memory device which is used as storage medium. For example, the storage device 300 may be a flash memory such as NAND flash or NOR flash or may be a resistive type memory such as a resistive random access memory (RRAM), a phase change random access memory (PRAM) or a magnetic random access memory (MRAM). The storage device 300 may store data when a power is cut-off. The storage device may comprise one or more semiconductor chips, such as a memory chip or stack of memory chips having memory arrays of the memory described herein. The memory chip or stack of memory chips of the may be mounted to the package substrate of the external package and electrically connected to memory pins 301-1~310-m by package wiring, such as via wiring of the package substrate (such as a redistribution layer of the package substrate).

The storage device 300 may be separate from the SIM circuit 200 inside of the external package 100. For example, one or more first semiconductor chips may form the SIM circuit 200 and one or more second semiconductor chips, different from the first semiconductor chips, may form the storage device 300.

The memory pins 301-1~310-m may be formed on the surface of the external package 100 to provide a contacting surface for connection to the communication device. In some examples, all of the memory pins 301-1~310-m are electrically separate from all of the SIM pins 210-1~210-n. In other examples, all of the memory pins 301-1~310-m are electrically separate from all of the SIM pins 210-1~210-n that provide information to the SIM circuit 200 and the storage device 300 (e.g., pins used to transmit commands, data and address information to the SIM circuit 200 and the storage device 300 are electrically separate from each other, but pins used to transmit power may be shared). Pins that are "electrically separate" are used by and dedicated to only one of SIM circuit 200 and memory device 300, but not the other. The SIM pins 210-1~210-n and the memory pins 301-1~310-m may be formed on a same surface of the external package 100.

As will be described with reference to FIGS. 9 and 10, when the semiconductor IC card 10 is mounted on a communication device, the storage device 300 may be connected to the communication device via the memory pins 310-1~310-n. The storage device 300 may store data provided from the communication device that is unrelated to SIM circuit 200 operation.

In an exemplary embodiment, the storage device 300 may transmit/receive data to/from an external device via the memory pins 310-1~310-n by using a serial interface of the storage device 300. For example, the storage device 300 may correspond to a universal flash storage (UFS) device. Therefore, the storage device 300 may transmit and receive data at a high speed. The serial interface of the storage device 300 may comprise one or more data buffers (e.g., each memory chip of storage device 300 may comprise a data buffer) that are configured to latch received serial data and convert the same to parallel data of a certain size for internal storage.

As described with reference to FIG. 1, the semiconductor IC card 10 may perform a first function as a storage device to store data and a second function as a SIM card to perform a sub scriber authentication simultaneously.

FIGS. 2 through 5 are diagrams illustrating examples of the semiconductor IC card when the semiconductor IC card of FIG. 1 has a shape and size according to a first standard.

As illustrated in FIGS. 2 through 5, an external package 100a of each of the semiconductor IC cards 20a, 20b, 20c and 20d has a shape and size defined by a nano SIM card standard.

Although it is illustrated in FIGS. 2 through 5 as the external package 100a of each of the semiconductor IC cards 20a, 20b, 20c and 20d has a shape and size defined by a nano SIM card standard, the external package 100a of each of the semiconductor IC cards 20a, 20b, 20c and 20d has a shape and size defined by a micro SIM card standard or mini SIM card standard. The external package 100a may comprise a semiconductor molding material, such as a resin based molding material, that forms the body of the external package 100a. The molding material may be formed about the package substrate described herein to encapsulate and protect the SIM circuit 200 and storage device 300 while allowing exposure of the SIM pins 210-1~210-n and the memory pins 301-1~310-m. The molding material forming the external package 100a may thus be formed a continuous, homogenous and/or monolithic structure.

Hereinafter, it is assumed that the external package 100a of each of the semiconductor IC cards 20a, 20b, 20c and 20d has a shape and size defined by the nano SIM card standard.

In addition, the SIM circuit 200 and the storage device 300 are omitted from the semiconductor IC cards 20a, 20b, 20c and 20d in FIGS. 2 through 5 for brevity of explanation.

In addition, it is illustrated that each of the semiconductor IC cards 20a, 20b, 20c and 20d includes a plurality of SIM pins 210-1~210-5 and a plurality of memory pins 310-1~310-5 in FIGS. 2 through 5. In FIGS. 2 through 5, the external package 100a may have two pairs of edges, in which the edges of each pair are arranged opposite to each other. The edges may include an edge 121 (i.e., an insertion edge) at an insertion side where each of the semiconductor IC cards 20a, 20b, 20c and 20d is inserted into a socket, a second edge 123 and a third edge 125 that adjoin the edge 121 at the insertion side, and a first edge 127 opposite the edge 121 at the insertion side. The insertion edge 121 and the first edge 127 may therefore provide one of the two pairs of edges, and the second edge 123 and third edge 125 may form the other. The edge 121 at the insertion side and the first edge 127 may be substantially parallel to each other.

Figure 2:
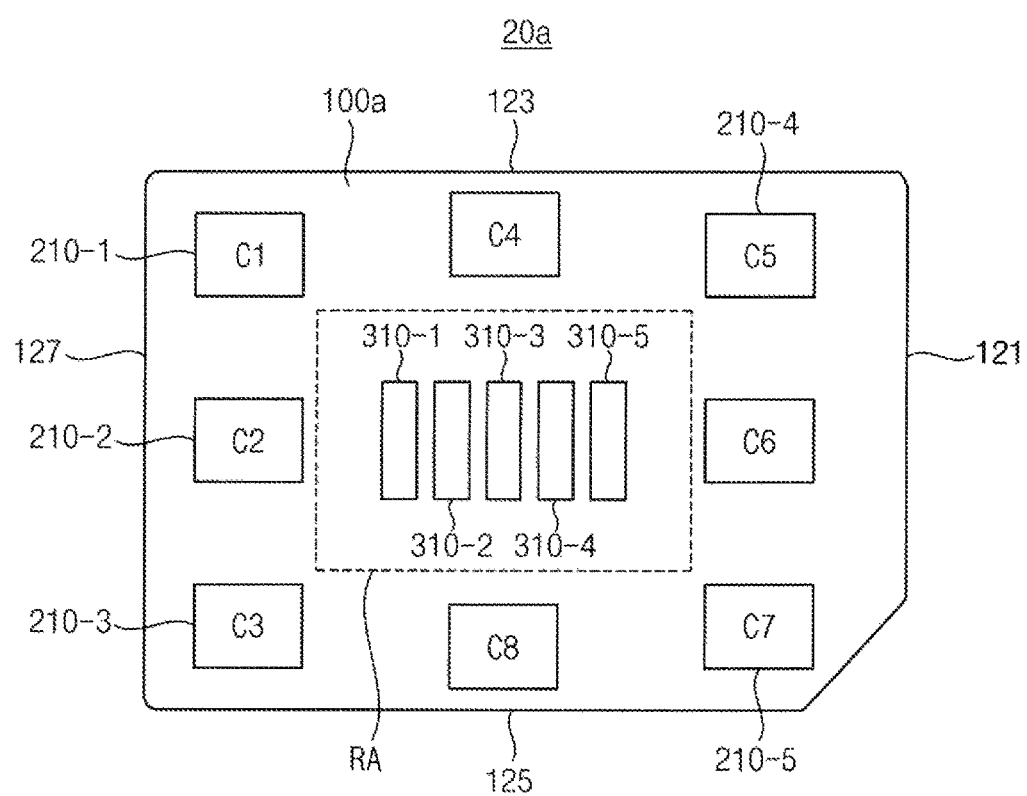
FIGS. 2 through 5 are diagrams illustrating examples of the semiconductor IC card when the semiconductor IC card of FIG. 1 has a shape and size according to a first standard.

Referring to FIG. 2, the external package 100a of the semiconductor IC card 20a may include a plurality of SIM standard pins C1~C8 which are formed on a surface of the external package 100a and are defined by the SIM card standard.

Each of the SIM pins 210-1~210-5 electrically connected to the SIM circuit 200 may correspond to one of the SIM standard pins C1~C8.

In a general SIM card, five SIM standard pins C1, C2, C3, C5 and C7 of the SIM standard pins C1~C8 are used and three SIM standard pins C4, C6 and C8 of the SIM standard pins C1~C8 are not used.

Therefore, the semiconductor IC card 20a may use the five SIM standard pins C1, C2, C3, C5 and C7 of the SIM standard pins C1~C8 as the SIM pins 210-1~210-5 electrically connected to the SIM circuit 200.

In an exemplary embodiment, the memory pins 310-1~310-5 may be formed in a reserved area RA on the surface of the external package 100a, in which the SIM standard pins C1~C8 are not formed.

According to the SIM card standard, external pins are not formed in a central area surrounded by the SIM standard pins C1~C8. Therefore, the reserved area RA may correspond to the central area surrounded by the SIM standard pins C1~C8 on the surface.

As mentioned above, the storage device 300 may correspond to a UFS device. In general, the UFS device may have fewer external pins for operation than other kinds of memory cards.

Therefore, the memory pins 310-1~310-5 for operation of the storage device 300 may be formed in the central area surrounded by the SIM standard pins C1~C8, on the surface of the external package 100a.

Figure 3:
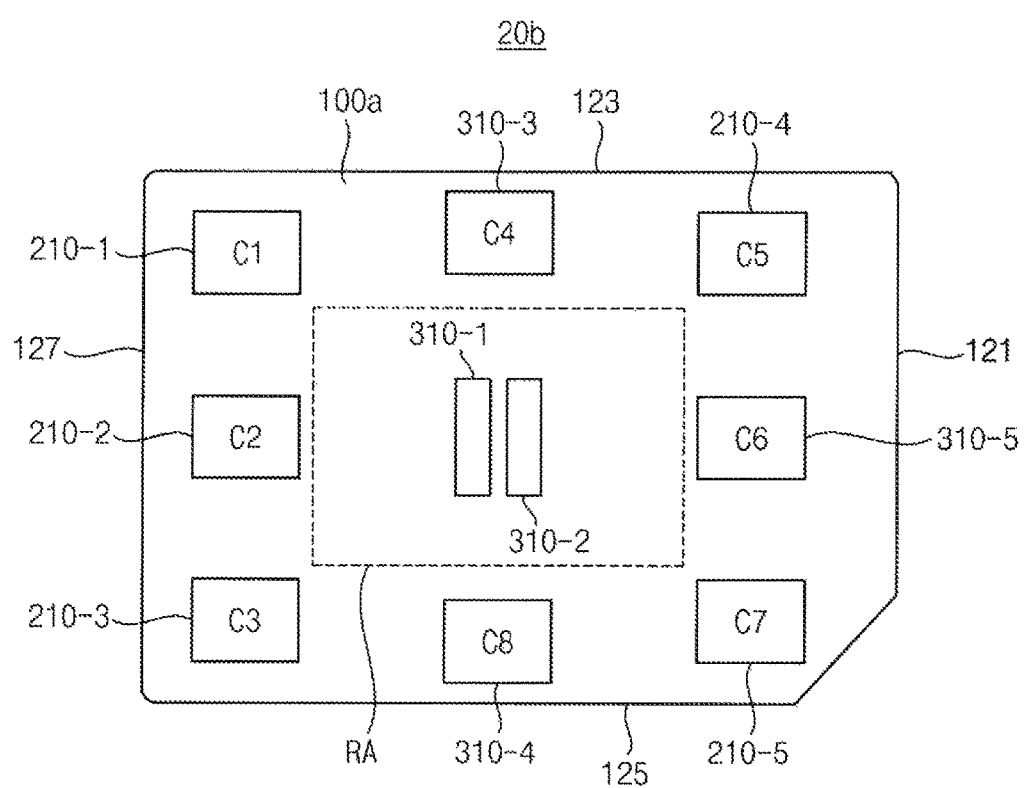

Referring to FIG. 3, the external package 100a of the semiconductor IC card 20b may include a plurality of SIM standard pins C1~C8 which are formed on a surface of the external package 100a and which are defined by the SIM card standard.

Each of the SIM pins 210-1~210-5 electrically connected to the SIM circuit 200 may correspond to one of the SIM standard pins C1~C8.

In a general SIM card, five SIM standard pins C1, C2, C3, C5 and C7 of the SIM standard pins C1~C8 are used and three SIM standard pins C4, C6 and C8 of the SIM standard pins C1~C8 are not used.

Therefore, the semiconductor IC card 20b may use the five SIM standard pins C1, C2, C3, C5 and C7 of the SIM standard pins C1~C8 as the SIM pins 210-1~210-5 electrically connected to the SIM circuit 200.

As mentioned above, the storage device 300 may correspond to a UFS device. In general, the UFS device may have fewer external pins for operation than other kinds of memory cards.

Therefore, the memory pins 310-1~310-5 for operation of the storage device 300 may be formed in the central area surrounded by the SIM standard pins C1~C8, on the surface of the external package 100a.

At least one of the memory pins 310-1~310-5 may correspond to at least one of the SIM standard pins C1~C8.

The semiconductor IC card 20b may use at least one of SIM standard pins C4, C6 and C8 of the SIM standard pins C1~C8, which are not used as the memory pins 310-1~310-5, as memory pins electrically connected to the storage device 300.

In FIG. 3, it is illustrated that the three SIM standard pins C4, C6 and C8 of the SIM standard pins C1~C8 are used as the memory pins 310-3, 310-4 and 310-5.

In this case, some memory pins 310-1 and 310-2 of the memory pins 310-1~310-5 may be formed on the surface of the external package 100a separately.

In an exemplary embodiment, some memory pins 310-1 and 310-2 of the memory pins 310-1~310-5 are formed in a reserved area RA on the surface of the external package 100a, in which the SIM standard pins C1~C8 are not formed.

According to the SIM card standard, external pins are not formed in a central area surrounded by the SIM standard pins C1~C8. Therefore, the reserved area RA may correspond to the central area surrounded by the SIM standard pins C1~C8 on the surface.

A number of memory pins which are additionally formed on the surface of the external package 100a in the semiconductor IC card 20b of FIG. 3 may be smaller than a number of memory pins which are additionally formed on the surface of the external package 100a in the semiconductor IC card 20a of FIG. 2.

Therefore, the semiconductor IC card 20b of FIG. 3 may be manufactured more simply than the semiconductor IC card 20a of FIG. 2.

Figure 4:
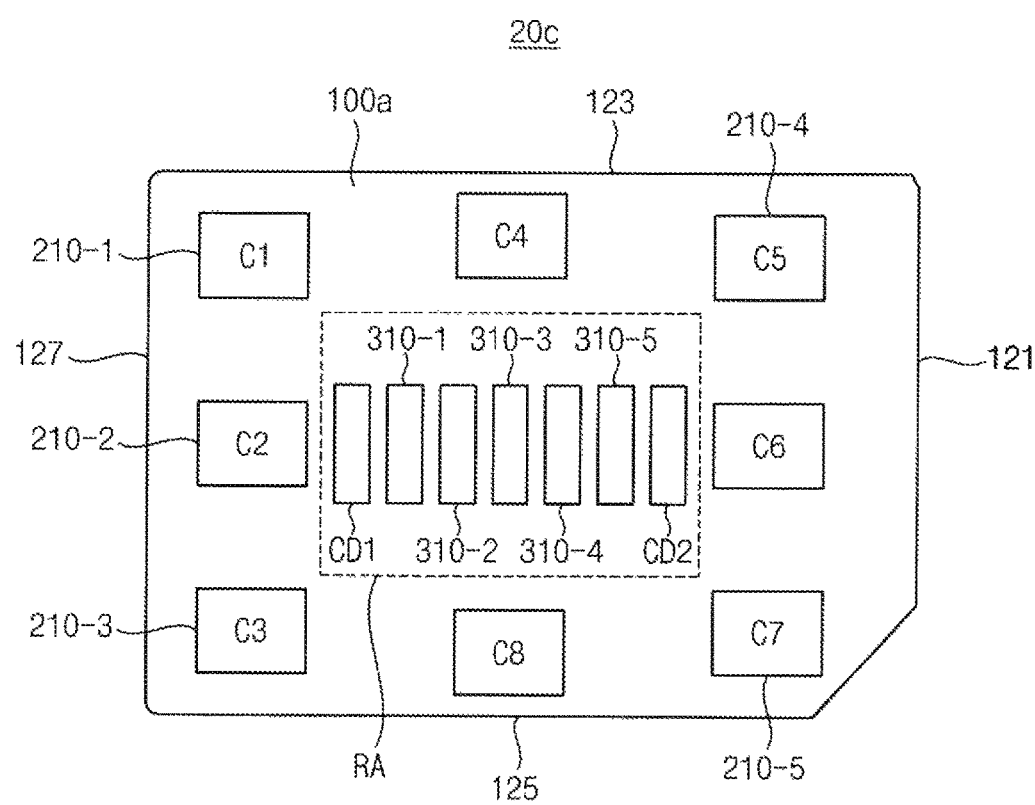

Referring to FIG. 4, the semiconductor IC card 20c differs from the semiconductor IC card 20a of FIG. 2 in that the semiconductor IC card 20c further includes a first card detection pin CD1 and a second card detection pin CD2 which are formed on the surface of the external package 100a.

The first card detection pin CD1 may be connected to a ground voltage. In an exemplary embodiment, the second card detection pin CD2 may be connected to a first voltage higher than the ground voltage. In another exemplary embodiment, the second card detection pin CD2 may be maintained at a floating state.

The semiconductor IC card 20c may provide different voltages to the first card detection pin CD1 and the second card detection pin CD2.

As will be described with reference to FIGS. 9 and 10, when the semiconductor IC card 20c is mounted on a communication device, the first card detection pin CD1 and the second card detection pin CD2 may be used to determine whether a card mounted on the communication device is the semiconductor IC card 20c or a normal SIM card.

For example, the communication device determines whether the card mounted on the communication device is the semiconductor IC card 20c or a normal SIM card by measuring voltages of the first card detection pin CD1 and the second card detection pin CD2.

Although it is illustrated with reference to FIG. 4 that the first card detection pin CD1 and the second card detection pin CD2 are formed separately on the surface of the external package 100a, some of the unused SIM standard pins C4, C6 and C8, which are not used as the SIM pins 210-1~210-5 of the SIM standard pins C1~C8 may be used as the first card detection pin CD1 and the second card detection pin CD2 in an exemplary embodiment.

Figure 5:
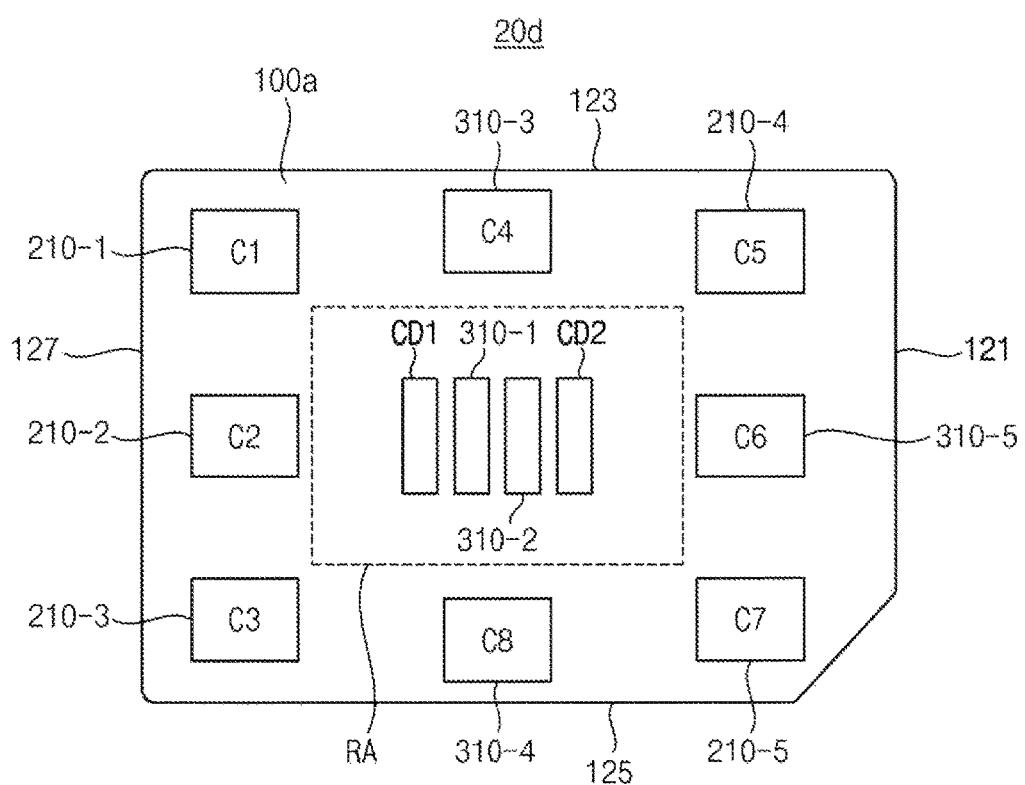

Referring to FIG. 5, the semiconductor IC card 20d differs from the semiconductor IC card 20b of FIG. 3 in that the semiconductor IC card 20d further includes a first card detection pin CD1 and a second card detection pin CD2 which are formed on the surface of the external package 100a.

The first card detection pin CD1 may be connected to a ground voltage. In an exemplary embodiment, the second card detection pin CD2 may be connected to a first voltage higher than the ground voltage. In another exemplary embodiment, the second card detection pin CD2 may be maintained at a floating state.

The semiconductor IC card 20d may provide different voltages to the first card detection pin CD1 and the second card detection pin CD2.

As will be described with reference to FIGS. 9 and 10, when the semiconductor IC card 20d is mounted on a communication device, the first card detection pin CD1 and the second card detection pin CD2 may be used to determine whether a card mounted on the communication device is the semiconductor IC card 20d or a normal SIM card.

For example, the communication device determines whether the card mounted on the communication device is the semiconductor IC card 20d or a normal SIM card by measuring voltages of the first card detection pin CD1 and the second card detection pin CD2.

Figure 6:
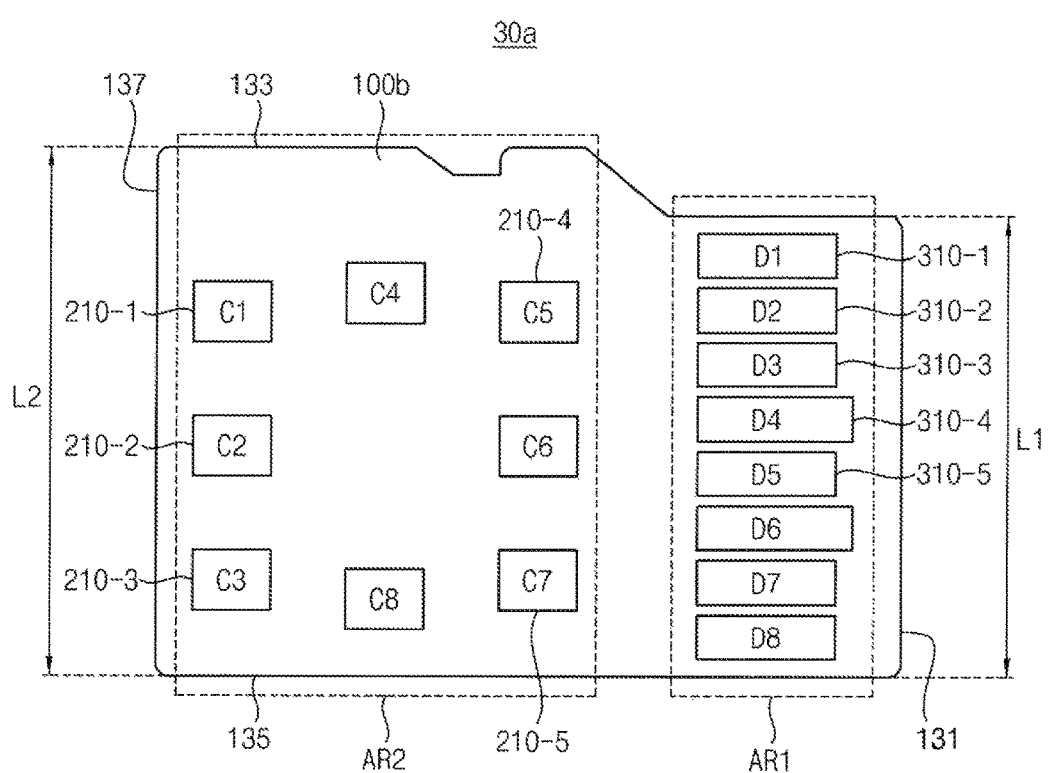
FIGS. 6 through 8 are diagrams illustrating examples of the semiconductor IC card when the semiconductor IC card of FIG. 1 has a shape and size according to a second standard.
Figure 7:
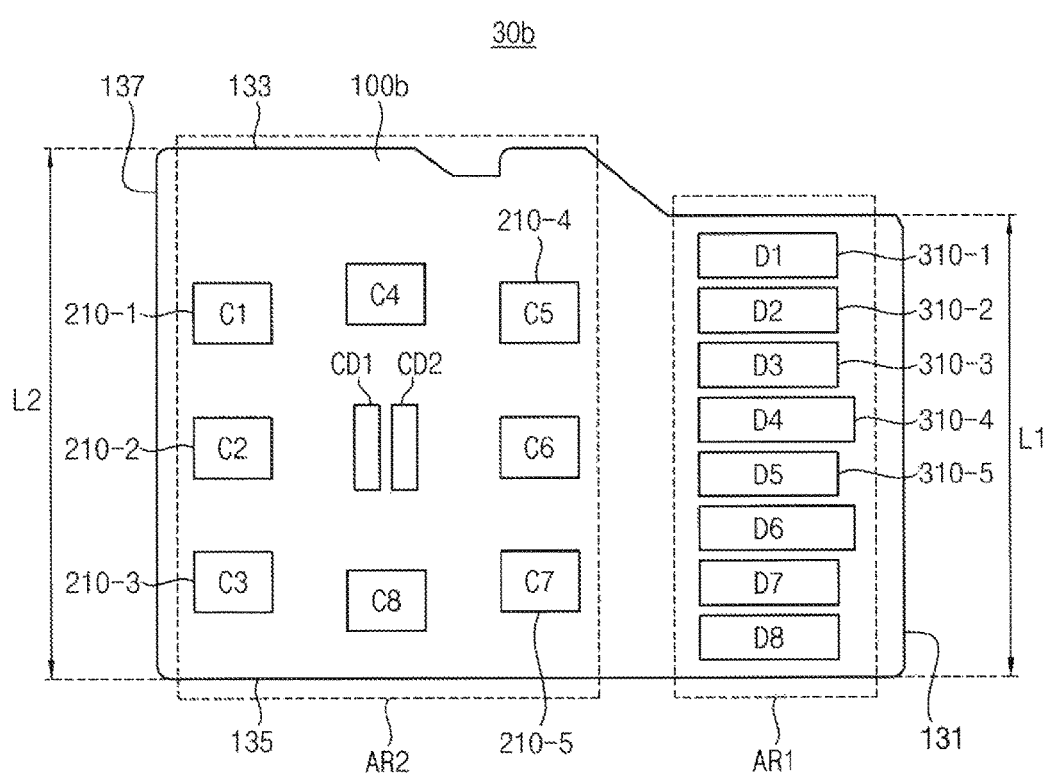
Figure 8:
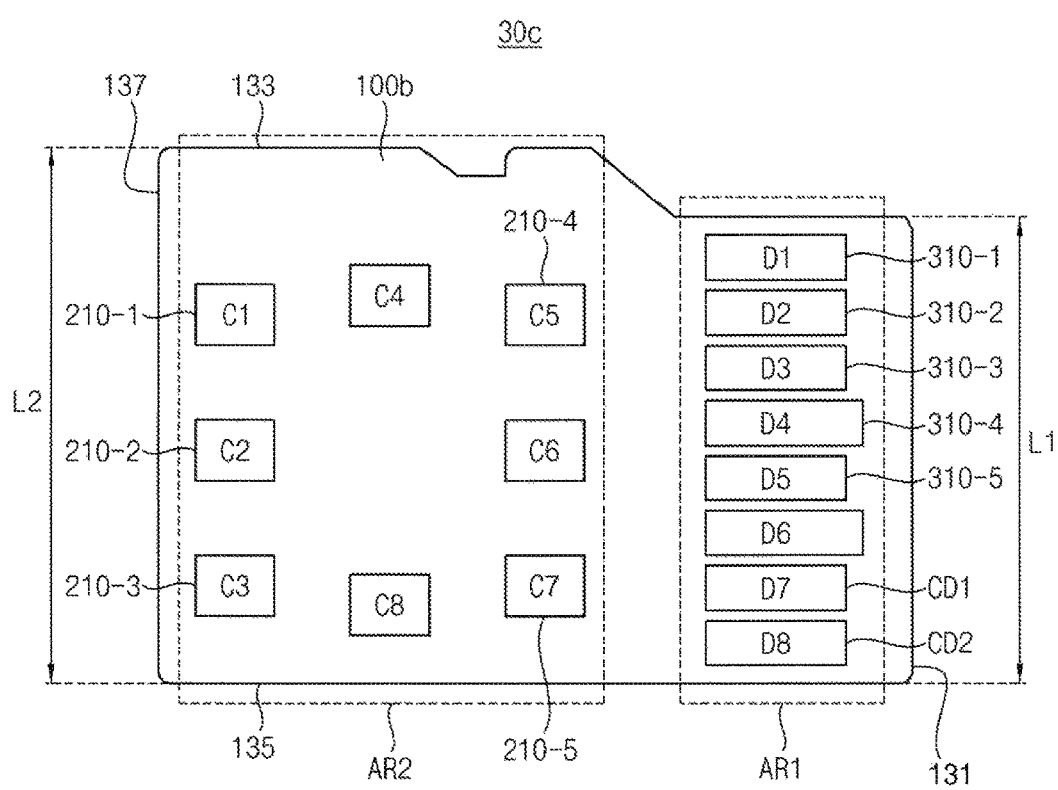

FIGS. 6 through 8 are diagrams illustrating examples of the semiconductor IC card when the semiconductor IC card of FIG. 1 has a shape and size according to a second standard.

As illustrated in FIGS. 6 through 8, an external package 100b of each of the semiconductor IC cards 30a, 30b and 30c has a shape and size defined by a micro SD card standard.

In addition, the SIM circuit 200 and the storage device 300 are omitted from the semiconductor IC cards 30a, 30b and 30c in FIGS. 6 through 8 for brevity of explanation.

In addition, it is illustrated that each of the semiconductor IC cards 30a, 30b and 30c includes a plurality of SIM pins 210-1~210-5 and a plurality of memory pins 310-1~310-5 in FIGS. 6 through 8. In FIGS. 6 through 8, the external package 100b may have two pairs of edges, in which the edges of each pair are arranged opposite to each other. The edges may include an edge 131 (i.e., an insertion edge) at an insertion side where each of the semiconductor IC cards 30a, 30b and 30c is inserted into a socket, a second edge 133 and a third edge 135 that adjoin the edge 131 at the insertion side, and a first edge 137 opposite the edge 131 at the insertion side. The insertion edge 131 and the first edge 137 may therefore provide one of the two pairs of edges, and the second edge 133 and third edge 135 may form the other. The edge 131 at the insertion side and the first edge 137 may be substantially parallel to each other.

Referring to FIG. 6, the external package 100b of the semiconductor IC card 30a may include a plurality of SD standard pins D1~D8 which are formed on a surface of the external package 100b and are defined by the micro SD card standard.

Each of the memory pins 310-1~310-5 electrically connected to the storage device 300 may correspond to one of the SD standard pins D1~D8.

As mentioned above, the storage device 300 may correspond to a UFS device. In general, the UFS device may have fewer external pins for operation than other kinds of memory cards.

Therefore, some of the SD standard pins D1~D8 may be used as the memory pins 310-1~310-5 for operation of the storage device 300.

In FIG. 6, it is illustrated that five SD standard pins D1, D2, D3, D4 and D5 of the SD standard pins D1~D8 are used as the memory pins 310-1~310-5.

In an exemplary embodiment, the SIM pins 210-1~210-5 may be formed in a reserved area on the surface of the external package 100b, in which the SD standard pins D1~D8 are not formed.

As illustrated in FIG. 6, according the micro SD standard, the SD standard pins D1~D8 are not formed in a first area AR1 adjacent to the insertion edge 131 and the insertion edge 131 has a first length L1. External pins are not formed in a second area AR2 adjacent to the first edge 137 having a second length L2 greater than the first length L1.

The SIM standard pins C1~C8 defined by the SIM card standard may be formed in the second area AR2, on the surface of the external package 100b. Each of the SIM pins 210-1~210-5 electrically connected to the SIM circuit 200 may correspond to one of the SIM standard pins C1~C8.

The semiconductor IC card 30a may use some of SIM standard pins C1~8 ard as the SIM pins 210-1~210-5 electrically connected to the SIM circuit 200.

According to the micro SD standard, the second area AR2 is wider than an area occupied by the SIM standard pins C1~C8.

Therefore, the SIM standard pins C1~C8 may be formed sufficiently in the second area AR2 of the external package 100b.

Referring to FIG. 7, the semiconductor IC card 30b differs from the semiconductor IC card 30a of FIG. 6 in that the semiconductor IC card 30b further includes a first card detection pin CD1 and a second card detection pin CD2 which are formed in the second area AR2, on the surface of the external package 100b.

The first card detection pin CD1 may be connected to a ground voltage. In an exemplary embodiment, the second card detection pin CD2 may be connected to a first voltage higher than the ground voltage. In another exemplary embodiment, the second card detection pin CD2 may be maintained at a floating state.

The semiconductor IC card 30b may provide different voltages to the first card detection pin CD1 and the second card detection pin CD2.

As will be described with reference to FIGS. 9 and 10, when the semiconductor IC card 30b is mounted on a communication device, the first card detection pin CD1 and the second card detection pin CD2 may be used to determine whether a card mounted on the communication device is the semiconductor IC card 30b or a normal SIM card.

For example, the communication device determines whether the card mounted on the communication device is the semiconductor IC card 30b or a normal SIM card by measuring voltages of the first card detection pin CD1 and the second card detection pin CD2.

Although it is illustrated with reference to FIG. 7 that the first card detection pin CD1 and the second card detection pin CD2 are formed separately in the second area AR2 of the external package 100b, the semiconductor IC card 30c of FIG. 8 uses some of unused SD standard pins D6, D7 and D8 of the SD standard pins D1~D8, which are not used as the memory pins 310-1~310-5, as the first card detection pin CD1 and the second card detection pin CD2 without forming the first card detection pin CD1 and the second card detection pin CD2 separately in the second area AR2 of the external package 100b.

The semiconductor IC card 30c of FIG. 8 differs from the semiconductor IC card 30b of FIG. 7 in that the semiconductor IC card 30c of FIG. 8 uses some of unused SD standard pins D6, D7 and D8 of the SD standard pins D1~D8, which are not used as the memory pins 310-1~310-5, as the first card detection pin CD1 and the second card detection pin CD2. Therefore, detailed description of the semiconductor IC card 30c of FIG. 8 will be omitted for the sake of brevity.

Figure 9:
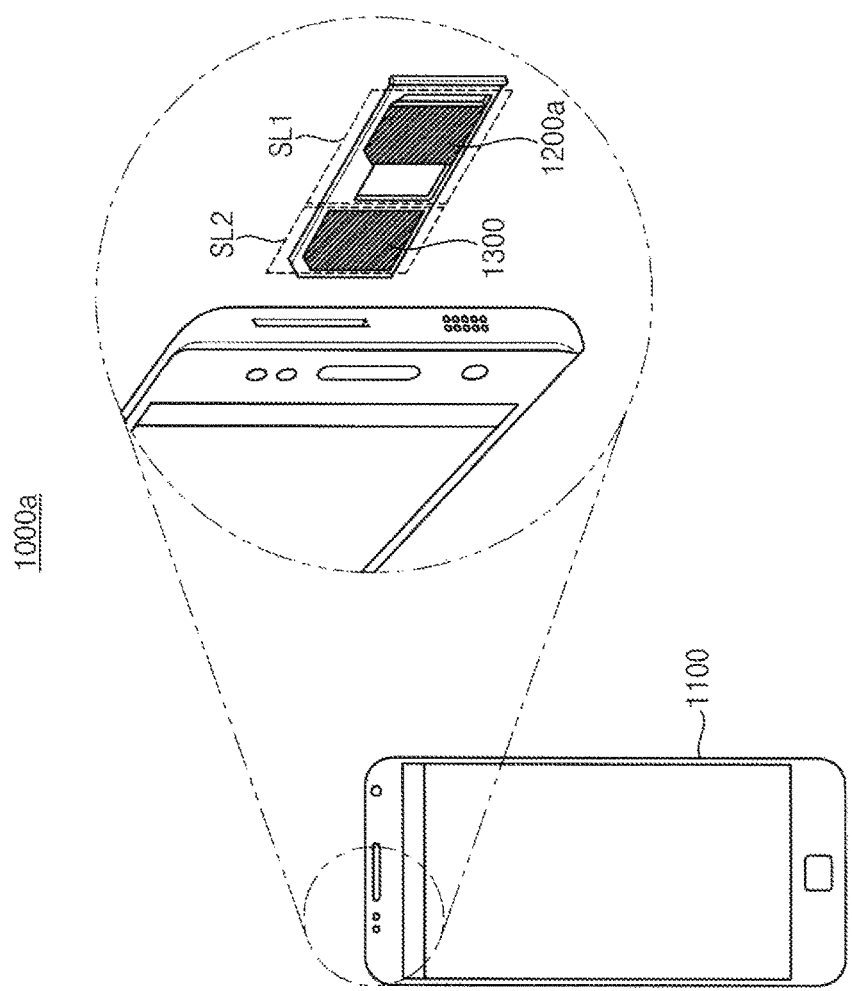
FIG. 9 is a block diagram illustrating a communication system according to exemplary embodiments.

FIG. 9 is a block diagram illustrating a communication system according to exemplary embodiments.

Referring to FIG. 9, a communication system 1000a may include a communication device 1100 and a semiconductor IC card 1200a.

In an exemplary embodiment, the communication system 1000a may further include a SIM card 1300.

The communication device 1100 may be an arbitrary communication device capable of performing wireless communication. For example, the communication device 1100 may be a smart phone, a tablet personal computer (PC), etc.

As illustrated in FIG. 9, the communication device 1100 may include a first external card slot SL1 and a second external card slot SL2 on which an external semiconductor card is mounted.

The first external card slot SL1 may accommodate selectively one of a card having a shape and a size defined by the SIM card standard and a card having a shape and a size defined by the micro SD card standard.

The second external card slot SL2 may accommodate a card having a shape and a size defined by the SIM card standard.

The semiconductor IC card 1200a may be mounted on (or may be inserted into) the first external card slot SL1. "Mounted on" as used herein refers to a removable connection (e.g., of the semiconductor IC card 1200a) to the communication device to allow a user of the communication device to attach and detach the semiconductor IC card 1200a in a secure manner. The removable connection may be comprise inserting the semiconductor IC card 1200a into a slot (which may hold the semiconductor IC card 1200a in place with a compressing force between the major surfaces of the semiconductor IC card 1200a and/or have a mechanical latch to prevent the card from being withdrawn until the latch is released). The removable connection may comprise removing a cover of the communication device, inserting the semiconductor IC card 1200a into a slot, and reattaching the cover of the communication device. It will be apparent that other types of removable connections may be implemented to mount the semiconductor IC card 1200a on the communication device.

As illustrated in FIG. 9, the semiconductor IC card 1200a may have a shape and a size defined by the SIM card standard.

The semiconductor IC card 1200a may employ one of the semiconductor IC cards 20a, 20b, 20c and 20d illustrated in FIGS. 2 through 5.

Therefore, when the semiconductor IC card 1200a is mounted on the first external card slot SL1 of the communication device 1100, the SIM circuit 200 in the semiconductor IC card 1200a is electrically connected to the communication device 1100 via the SIM pins 210-1~210-n and the storage device 300 in the semiconductor IC card 1200a is electrically connected to the communication device 1100 via the memory pins 310-1~310-m.

Therefore, the semiconductor IC card 1200a may simultaneously perform a first function to store data provided from the communication device 1100 and a second function to perform a subscriber authentication using first subscriber information when the communication device 1100 performs wireless communication through a first wireless network.

Since configuration and operation of each of the semiconductor IC cards 20a, 20b, 20c and 20d have been previously described with reference to FIGS. 2 through 5, a detailed description of the semiconductor IC card 1200a will not be repeated here for the sake of brevity.

The SIM card 1300 may be mounted on (or may be inserted into) the second external card slot SL2.

The SIM card 1300 may be a general SIM card having a shape and a size defined by a SIM card standard.

Therefore, the SIM card 1300 may perform a subscriber authentication using second subscriber information when the communication device 1100 performs wireless communication through a second wireless network.

Figure 10:
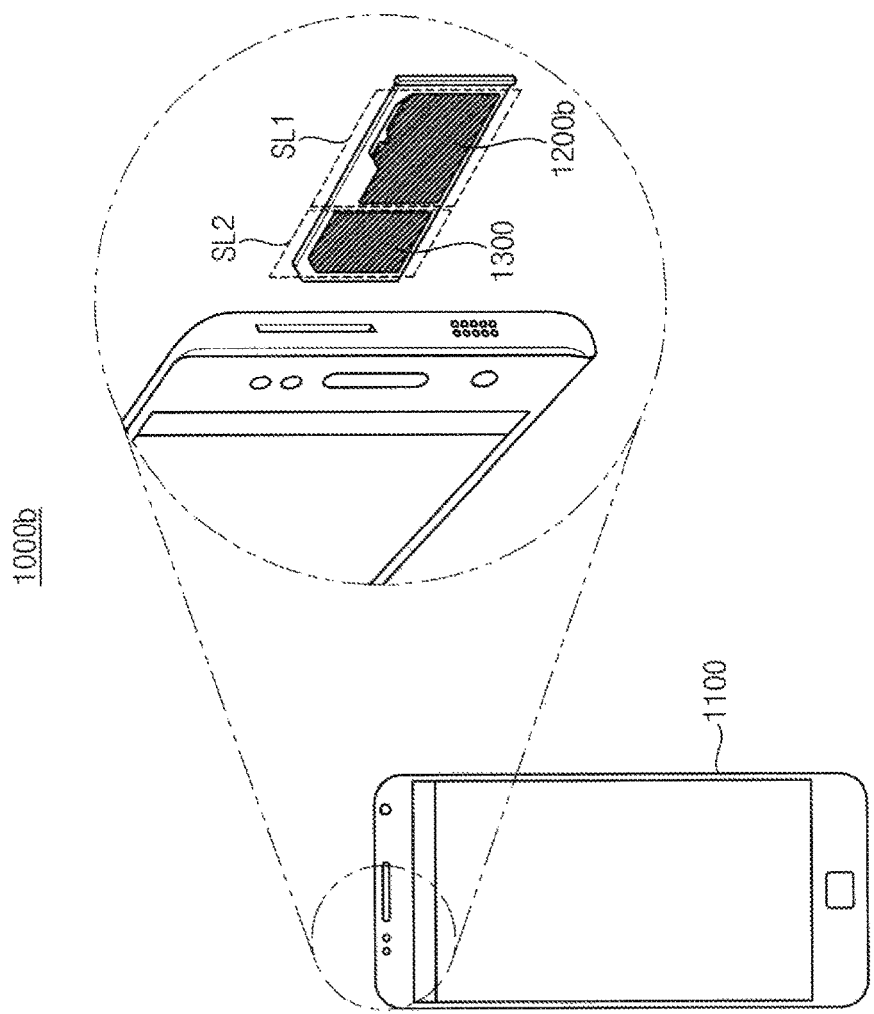
FIG. 10 is a block diagram illustrating a communication system according to exemplary embodiments.

FIG. 10 is a block diagram illustrating a communication system according to exemplary embodiments.

Referring to FIG. 10, a communication system 1000b may include a communication device 1100 and a semiconductor IC card 1200b.

In an exemplary embodiment, the communication system 1000b may further include a SIM card 1300.

As illustrated in FIG. 10, the communication device 1100 may include a first external card slot SL1 and a second external card slot SL2 on which an external semiconductor card is mounted.

The first external card slot SL1 may selectively accommodate one of a card having a shape and a size defined by the SIM card standard and a card having a shape and a size defined by the micro SD card standard.

The second external card slot SL2 may accommodate a card having a shape and a size defined by the SIM card standard.

The semiconductor IC card 1200b may be mounted on (or may be inserted into) the first external card slot SL1.

As illustrated in FIG. 10, the semiconductor IC card 1200b may have a shape and a size defined by the micro SD card standard.

The semiconductor IC card 1200b may employ one of the semiconductor IC cards 30a, 30b and 30c illustrated in FIGS. 6 through 8.

Therefore, the semiconductor IC card 1200b may simultaneously perform a first function to store data provided from the communication device 1100 and a second function to perform subscriber authentication using first subscriber information when the communication device 1100 performs wireless communication through a first wireless network.

Since configuration and operation of each of the semiconductor IC cards 30a, 30b and 30c have been previously described with reference to FIGS. 6 through 8, a detailed description of the semiconductor IC card 1200b will not be repeated here for the sake of brevity.

The semiconductor IC card 1200b in the communication system 1000b of FIG. 10 differs from the semiconductor IC card 1200a in the communication system 1000a of FIG. 9 in that while the semiconductor IC card 1200a in the communication system 1000a of FIG. 9 has a shape and a size defined by the SIM card standard, the semiconductor IC card 1200b in the communication system 1000b of FIG. 10 has a shape and a size defined by the micro SD card standard.

In general, when a communication device is to perform wireless communication through two different wireless networks, two SIM cards corresponding to the two wireless networks should be mounted on the communication device.

Conventionally, the communication device 1100 in the communication system 1000a or 1000b in FIGS. 9 and 10, includes the first external card slot SL1 and the second external card slot SL2 on which an external semiconductor card is to be mounted, the communication device 1100 cannot use an additional external memory card because the communication device 1100 lacks a third slot to which the external memory card may be mounted (because the first and second external card slots SL1 and SL2 are occupied by two conventional SIM cards).

However, as described with reference to FIGS. 9 and 10, the semiconductor IC card 1200a or 1200b which is mounted on the first external card slot SL1 of the communication device 1100 may comprise both a SIM circuit 200 and a storage device 300 to thus simultaneously perform a first function to store data provided from the communication device 1100 as a storage device and a second function to perform subscriber authentication as a SIM card when the communication device 1100 performs wireless communication.

Therefore, the communication system 1000a or 1000b including the semiconductor IC card 1200a or 1200b may use the semiconductor IC card 1200a or 1200b as an external memory card while performing wireless communication through two different wireless networks, although the communication system 1000a or 1000b includes two external card slots SL1 and SL2.

The storage device 300 in the semiconductor IC card 1200a or 1200b may correspond to a UFS device. The UFS device transmits/receives data using a serial interface, and the UFS device may operate normally when a distance between the UFS device and a UFS host is long.

Therefore, when the semiconductor IC card 1200a or 1200b is mounted on the first external card slot SL1 of the communication system 1000a or 1000b, the storage device 300 may operate normally even though a distance between the storage device 300 and an application processor is long.

Figure 11:
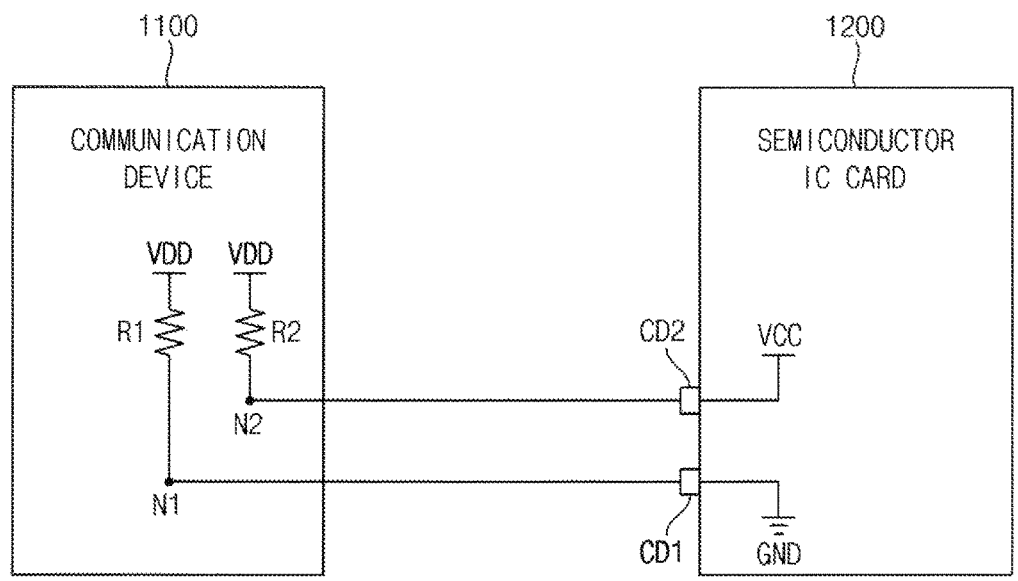
FIGS. 11 and 12 are diagrams for explaining that the communication device in the communication system of FIGS. 9 and 10 detects whether a semiconductor IC card is mounted.
Figure 12:
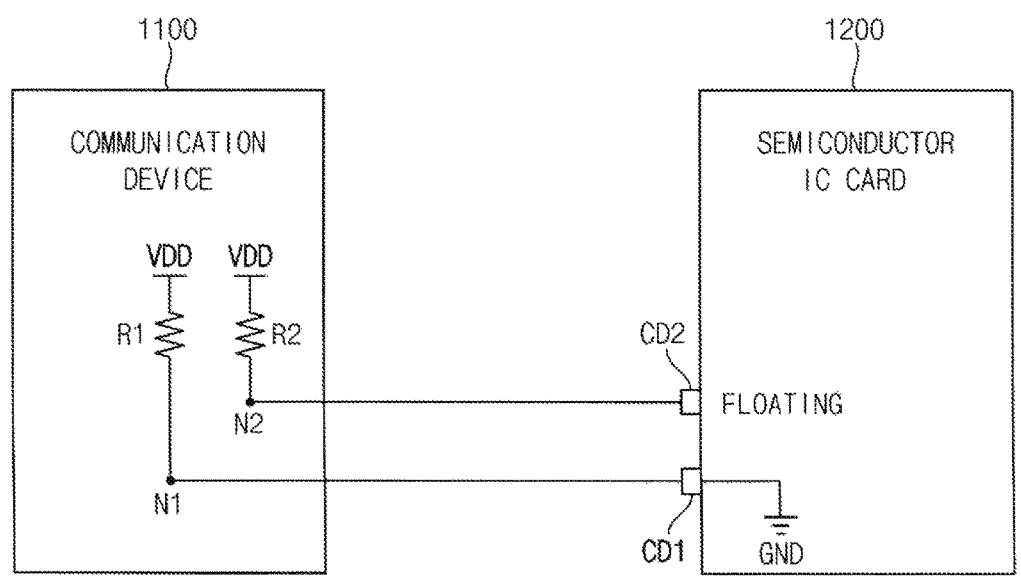

FIGS. 11 and 12 are diagrams for explaining that the communication device in the communication system of FIGS. 9 and 10 detects whether a semiconductor IC card is mounted.

As described with reference to FIGS. 4, 5, 7 and 8, a semiconductor IC card 1200 corresponding to one of the semiconductor IC cards 1200a and 1200b, includes the first card detection pin CD1 and the second card detection pin CD2.

As illustrated in FIGS. 11 and 12, the first card detection pin CD1 may be electrically connected to a ground voltage GND.

In an exemplary embodiment, the second card detection pin CD2 may be electrically connected to a first voltage VCC higher than the ground voltage GND as illustrated in FIG. 11.

In another exemplary embodiment, the second card detection pin CD2 may be maintained at a floating state as illustrated in FIG. 12.

As illustrated in FIGS. 11 and 12, the communication device 1100 may include a first pull-up resistor R1 and a second pull-up resistor R2.

The first pull-up resistor R1 may be connected between a power supply voltage VDD and a first node N1 electrically connected to the first card detection pin CD1 of the semiconductor IC card 1200 when the semiconductor IC card 1200 is mounted on the first external card slot SL1.

The second pull-up resistor R2 may be connected between the power supply voltage VDD and a second node N2 electrically connected to the second card detection pin CD2 of the semiconductor IC card 1200 when the semiconductor IC card 1200 is mounted on the first external card slot SL1.

As illustrated in FIG. 11, when the second card detection pin CD2 is electrically connected to the first voltage VCC higher than the ground voltage GND, the communication device 1100 determines that the semiconductor IC card 1200 is mounted on the first external card slot SL1 when a voltage of the first node N1 corresponds to the ground voltage GND and a voltage of the second node N2 corresponds to the first voltage VCC.

As illustrated in FIG. 12, when the second card detection pin CD2 is maintained at a floating state, the communication device 1100 determines that the semiconductor IC card 1200 is mounted on the first external card slot SL1 when a voltage of the first node N1 corresponds to the ground voltage GND and a voltage of the second node N2 corresponds to the power supply voltage VDD.

FIG. 13 is a flow chart illustrating an initial operation when the communication system of FIGS. 9 and 10 is turned-on.

When the communication device 1100 is turned-on (S110), the communication device 1100 determines whether the semiconductor IC card 1200 or a general SIM card is mounted on the first external card slot SL1 (S120).

The communication device 1100 determines whether the semiconductor IC card 1200 is mounted on the first external card slot SL1 based on a method described with reference to FIGS. 9 and 10.

When the communication device 1100 determines that the semiconductor IC card 1200 is mounted on the first external card slot SL1 (YES in S120), the communication device 1100 provides a power supply voltage to the storage device 300 in the semiconductor IC card 1200 via the memory pins 310-1~310-5 (S130).

Therefore, the storage device 300 is turned-on, and the communication device 1100 performs a start-up operation on the storage device 300 (S140). The communication device 1100 may use the storage device 300 as storage media.

Afterwards, the communication device 1100 performs a normal operation (S150).

When the communication device 1100 repeatedly determines whether the semiconductor IC card 1200 is mounted on the first external card slot SL1 during a given time interval, and the communication device 1100 determines that the general SIM card instead of the semiconductor IC card 1200 is mounted on the first external card slot SL1 during the given time interval, the communication device 1100 immediately performs the normal operation (S150) without providing a power supply voltage for operation of the storage device 300 to the storage device 300.

Therefore, when the communication system 1000a or 1000b in FIG. 9 or FIG. 10 determines that the semiconductor IC card 1200 is mounted on the first external card slot SL1, the communication system 1000a or 1000b performs a normal operation by using the semiconductor IC card 1200 as a storage media in addition to using the semiconductor IC card 1200 as a SIM card.

On the contrary, when the communication system 1000a or 1000b in FIG. 9 or FIG. 10 determines that the general SIM card is mounted on the first external card slot SL1, the communication system 1000a or 1000b performs a normal operation by using the card mounted on the first external card slot SL1 as a SIM card.

The present disclosure may be applied to various communication devices. For example, the present disclosure may be applied to a mobile phone, a smart phone, a personal digital assistant (PDA), a tablet PC, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A semiconductor integrated circuit (IC) card comprising:
an external package;
a subscriber identification module (SIM) circuit formed inside of the external package, the SIM circuit configured to store subscriber information;
a plurality of SIM pins which are formed on a surface of the external package and a first set of pins of the SIM pins is electrically connected to the SIM circuit;
a storage device which is formed inside of the external package and is separated from the SIM circuit, the storage device including a nonvolatile memory device;
a plurality of memory pins which are formed on the surface of the external package and are electrically connected to the storage device;
a first card detection pin which is formed on the surface and is electrically connected to a ground voltage; and
a second card detection pin which is formed on the surface and is electrically connected to a first voltage higher than the ground voltage,
wherein the first voltage is provided from an inside of the semiconductor IC card,
wherein a second set of pins of the SIM pins is not electrically connected to the SIM circuit,
wherein one or more pins of the second set of pins of the SIM pins are configured for use as one or more respective memory pins, and
wherein the external package has a shape and a size defined by a SIM card standard, and the plurality of SIM pins which are formed on the surface are defined by the SIM card standard.

2. The semiconductor IC card of claim 1, wherein each of the SIM pins corresponds to a respective pin of SIM standard pins.

3. The semiconductor IC card of claim 1, wherein the memory pins are formed in a central region on the surface of the external package and the central region is surrounded by the SIM pins.

4. The semiconductor IC card of claim 1, wherein the storage device is configured to transmit/receive data to/from an external device through the memory pins by using a serial interface.

5. The semiconductor IC card of claim 1, wherein the storage device corresponds to a universal flash storage (UFS) device.

6. A communication system comprising:
a communication device including a first external card slot and a second external card slot; and
a semiconductor integrated circuit (IC) card, mounted on the first external card slot, the semiconductor IC card configured to perform a first function to store data provided from the communication device and a second function to perform a subscriber authentication using a first subscriber information when the communication device performs a wireless communication via a first wireless network,
wherein the semiconductor IC card comprises;
an external package;
a subscriber identification module (SIM) circuit formed inside of the external package, the SIM circuit configured to store the first subscriber information;
a plurality of SIM pins which are formed on a surface of the external package and electrically connected to the SIM circuit;
a storage device which is formed inside of the external package and is separated from the SIM circuit, the storage device including a nonvolatile memory device;
a plurality of memory pins which are formed on the surface of the external package and are electrically connected to the storage device;
a first card detection pin which is formed on the surface and is electrically connected to a ground voltage; and
a second card detection pin which is formed on the surface and is electrically connected to a first voltage higher than the ground voltage or is maintained in a state in which no current flows through the second card detection pin, and
wherein the communication device comprises:
a first pull-up resistor connected between a power supply voltage and a first node electrically connected to the first card detection pin when the semiconductor IC card is mounted on the first external card slot; and
a second pull-up resistor connected between the power supply voltage and a second node electrically connected to the second card detection pin when the semiconductor IC card is mounted on the first external card slot,
wherein the communication device is configured to determine that the semiconductor IC card is mounted on the first external card slot when a voltage of the first node corresponds to the ground voltage and a voltage of the second node corresponds to the first voltage or corresponds to the power supply voltage.

7. The communication system of claim 6, further comprising:
a SIM card, mounted on the second external card slot, the SIM card configured to perform the subscriber authentication using a second subscriber information when the communication device performs a wireless communication via a second wireless network,
wherein the storage device corresponds to a universal flash storage (UFS) device.

8. A semiconductor integrated circuit (IC) card comprising:
an external package;
a subscriber identification module (SIM) circuit formed inside of the external package, the SIM circuit configured to store subscriber information;
a plurality of SIM pins which are formed on a surface of the external package and are electrically connected to the SIM circuit;
a storage device which is formed inside of the external package and is separated from the SIM circuit, the storage device including a nonvolatile memory device;
a plurality of memory pins which are formed on the surface of the external package and are electrically connected to the storage device;
a first card detection pin which is formed on the surface of the external package and is electrically connected to a ground voltage; and
a second card detection pin which is formed on the surface of the external package and is either electrically connected to a first voltage higher than the ground voltage,
wherein the first voltage is provided from an inside of the semiconductor IC card,
wherein the external package has a shape and a size defined by a micro secure digital (SD) card standard, and the external package includes a plurality of SD standard pins which are formed on the surface of the external package and are defined by the micro SD card standard, wherein the SD standard pins are configured for use as the memory pins, wherein the SD standard pins are formed in a first area adjacent to an edge of an insertion side of the external package, wherein the SIM pins are formed in a second area adjacent to a first edge opposite to the edge of the insertion side, and wherein the first and second card detection pins are formed in the first area.

9. The semiconductor IC card of claim 8, wherein the edge of the insertion side has a first length and the first edge has a second length greater than the first length.

10. The semiconductor IC card of claim 8, wherein the storage device is configured to transmit/receive data to/from an external device through the memory pins by using a serial interface.

11. The semiconductor IC card of claim 8, wherein the storage device corresponds to a universal flash storage (UFS) device.

* * * * *